US010079192B2

United States Patent
Hsiao et al.

(10) Patent No.: US 10,079,192 B2
(45) Date of Patent: Sep. 18, 2018

(54) SEMICONDUCTOR CHIP PACKAGE ASSEMBLY WITH IMPROVED HEAT DISSIPATION PERFORMANCE

(71) Applicant: MEDIATEK INC., Hsin-Chu (TW)

(72) Inventors: Ching-Wen Hsiao, Hsinchu (TW); Tzu-Hung Lin, Hsinchu County (TW); I-Hsuan Peng, Hsinchu (TW); Tung-Hsien Hsieh, Hsinchu County (TW); Sheng-Ming Chang, New Taipei (TW)

(73) Assignee: MediaTek Inc., Hsin-Chu (TW)

( * ) Notice: Subject to any disclaimer, the term of this patent is extended or adjusted under 35 U.S.C. 154(b) by 0 days.

(21) Appl. No.: 15/064,545

(22) Filed: Mar. 8, 2016

(65) Prior Publication Data
US 2016/0329262 A1    Nov. 10, 2016

Related U.S. Application Data

(60) Provisional application No. 62/157,054, filed on May 5, 2015.

(51) Int. Cl.
*H01L 23/367*   (2006.01)
*H01L 23/50*    (2006.01)
(Continued)

(52) U.S. Cl.
CPC ...... *H01L 23/3675* (2013.01); *H01L 23/3114* (2013.01); *H01L 23/3121* (2013.01);
(Continued)

(58) Field of Classification Search
CPC ............. H01L 2224/03011; H01L 2224/11011
See application file for complete search history.

(56) References Cited

U.S. PATENT DOCUMENTS 6,521,997 B1 *  2/2003  Huang ................ H01L 23/3121
                                                        174/255
8,174,116 B2 *  5/2012  Masuda .................... H01G 2/06
                                                        257/717
(Continued)

FOREIGN PATENT DOCUMENTS

CN    102468257 A     5/2012
TW    201246499 A1   11/2012
TW    201324708 A1    6/2013

*Primary Examiner* — Tom Thomas
*Assistant Examiner* — Steven B Gauthier
(74) *Attorney, Agent, or Firm* — Wolf, Greenfield & Sacks, P.C.

(57) ABSTRACT

A semiconductor chip package assembly includes a package substrate having a chip mounting surface; a plurality of solder pads disposed on the chip mounting surface; a first dummy pad and a second dummy pad spaced apart from the first dummy pad disposed on the chip mounting surface; a solder mask on the chip mounting surface and partially covering the solder pads, the first dummy pad, and the second dummy pad; a chip package mounted on the chip mounting surface and electrically connected to the package substrate through a plurality of solder balls on respective said solder pads; a discrete device having a first terminal and a second terminal disposed between the chip package and the package substrate; a first solder connecting the first terminal with the first dummy pad and the chip package; and a second solder connecting the second terminal with the second dummy pad and the chip package.

15 Claims, 4 Drawing Sheets

(51) Int. Cl.
    *H01L 23/538*     (2006.01)
    *H01L 23/00*     (2006.01)
    *H01L 25/10*     (2006.01)
    *H01L 25/16*     (2006.01)
    *H01L 23/31*     (2006.01)
    *H01L 23/498*     (2006.01)
    *H01L 25/065*     (2006.01)

(52) U.S. Cl.
    CPC .... *H01L 23/3677* (2013.01); *H01L 23/49816* (2013.01); *H01L 23/49838* (2013.01); *H01L 23/49894* (2013.01); *H01L 23/50* (2013.01); *H01L 23/5389* (2013.01); *H01L 24/06* (2013.01); *H01L 24/16* (2013.01); *H01L 24/17* (2013.01); *H01L 24/19* (2013.01); *H01L 25/0655* (2013.01); *H01L 25/0657* (2013.01); *H01L 25/105* (2013.01); *H01L 25/16* (2013.01); *H01L 23/49822* (2013.01); *H01L 24/32* (2013.01); *H01L 24/48* (2013.01); *H01L 24/73* (2013.01); *H01L 2224/02373* (2013.01); *H01L 2224/0401* (2013.01); *H01L 2224/04105* (2013.01); *H01L 2224/05572* (2013.01); *H01L 2224/12105* (2013.01); *H01L 2224/131* (2013.01); *H01L 2224/13147* (2013.01); *H01L 2224/16055* (2013.01); *H01L 2224/16057* (2013.01); *H01L 2224/16227* (2013.01); *H01L 2224/16265* (2013.01); *H01L 2224/32225* (2013.01); *H01L 2224/48091* (2013.01); *H01L 2224/48227* (2013.01); *H01L 2224/73204* (2013.01); *H01L 2224/73265* (2013.01); *H01L 2224/73267* (2013.01); *H01L 2224/92125* (2013.01); *H01L 2225/0652* (2013.01); *H01L 2225/06517* (2013.01); *H01L 2225/06524* (2013.01); *H01L 2225/06589* (2013.01); *H01L 2225/1035* (2013.01); *H01L 2225/1041* (2013.01); *H01L 2225/1058* (2013.01); *H01L 2225/1094* (2013.01); *H01L 2924/00014* (2013.01); *H01L 2924/10253* (2013.01); *H01L 2924/15311* (2013.01); *H01L 2924/19041* (2013.01); *H01L 2924/19042* (2013.01); *H01L 2924/19043* (2013.01); *H01L 2924/19103* (2013.01); *H01L 2924/19104* (2013.01)

(56) References Cited

U.S. PATENT DOCUMENTS

| | | | |
|---|---|---|---|
| 2004/0256133 A1* | 12/2004 | Dishongh | H01L 23/50 174/541 |
| 2006/0060954 A1 | 3/2006 | Meyer-Berg | |
| 2010/0265682 A1* | 10/2010 | Martinez | H01L 23/49816 361/782 |
| 2011/0127680 A1* | 6/2011 | Masuda | H01G 2/06 257/779 |
| 2014/0252544 A1 | 9/2014 | Li et al. | |

\* cited by examiner

SEMICONDUCTOR CHIP PACKAGE ASSEMBLY WITH IMPROVED HEAT DISSIPATION PERFORMANCE

CROSS REFERENCE TO RELATED APPLICATIONS

This application claims the benefit of U.S. provisional application No. 62/157,054 filed May 5, 2015.

BACKGROUND

The present invention relates to a chip package assembly, and more particularly to a semiconductor chip package assembly with improved heat dissipation performance.

In a conventional method for forming a semiconductor chip package assembly, a chip (or a chip package) is electrically connected to a package substrate and mechanically bonded in a solder joining operation. The chip is aligned with and placed onto a placement site on the package substrate such that the solder balls are aligned with electrical pads or pre-solder on the substrate. The substrate is typically composed of an organic material or laminate. Heat is then applied causing the solder balls to alloy and form electrical connections between the chip and the package substrate.

For chip packages, electrical performance and dissipation control are two major challenges. In the aspect of electrical performance, chip packages have to maintain signal integrity and operating frequency of semiconductor devices. In the aspect of dissipation control, it is required that chip packages efficiently dissipate heat generated by the semiconductor chip.

A heat spreader or lid, typically composed of a high thermal conductivity material, and having substantially the same dimensions as the package substrate is typically attached over the substrate and the chip by a thermally conductive adhesive. The purpose of the heat spreader is to disperse the heat generated during operation to reduce stress in the package.

With the rapid development of semiconductor technology, the number of I/O pads in a chip has dramatically increased, and the power that each chip consumes has also increased. The heat spreader typically mounted on the inactive surface of the flipped chip does not efficiently dissipate the heat from the active surface of the chip (or land side of a chip package). Therefore, there is a need in this industry to provide a chip package assembly with improved heat dissipation performance.

SUMMARY

It is an objective of the claimed invention to provide a semiconductor chip package assembly with improved heat dissipation performance.

According to one embodiment, a semiconductor chip package assembly includes a package substrate having a chip mounting surface; a plurality of solder pads disposed on the chip mounting surface; a first dummy pad and a second dummy pad spaced apart from the first dummy pad disposed on the chip mounting surface; a solder mask on the chip mounting surface and partially covering the solder pads, the first dummy pad, and the second dummy pad; a chip package mounted on the chip mounting surface and electrically connected to the package substrate through a plurality of solder balls on respective solder pads; a discrete device having a first terminal and a second terminal disposed between the chip package and the package substrate; a first solder connecting the first terminal with the first dummy pad and the chip package; and a second solder connecting the second terminal with the second dummy pad and the chip package. The discrete device may comprise a land side capacitor, a de-coupling capacitor, a resistor, or an inductor.

According to another embodiment, a semiconductor chip package assembly includes a substrate having a chip mounting surface; a plurality of solder pads disposed on the chip mounting surface; a first dummy pad and a second dummy pad spaced apart from the first dummy pad disposed on the chip mounting surface; a solder mask on the chip mounting surface and partially covering the solder pads, the first dummy pad, and the second dummy pad; a multi-chip package mounted on the chip mounting surface and electrically connected to the substrate through a plurality of solder balls on respective solder pads; a discrete device having a first terminal and a second terminal disposed between the chip package and the substrate; a first solder connecting the first terminal with the first dummy pad and the multi-chip package; and a second solder connecting the second terminal with the second dummy pad and the multi-chip package.

According to yet another embodiment, a semiconductor chip package assembly includes a substrate having a chip mounting surface; a plurality of solder pads disposed on the chip mounting surface; a first dummy pad and a second dummy pad spaced apart from the first dummy pad disposed on the chip mounting surface; a solder mask on the chip mounting surface and partially covering the solder pads, the first dummy pad, and the second dummy pad; a package-on-package (PoP) mounted on the chip mounting surface and electrically connected to the substrate through a plurality of solder balls on respective solder pads; a discrete device having a first terminal and a second terminal disposed between the chip package and the substrate; a first solder connecting the first terminal with the first dummy pad and the PoP; and a second solder connecting the second terminal with the second dummy pad and the PoP.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

In the following detailed description of embodiments of the invention, reference is made to the accompanying drawings, which form a part hereof, and in which is shown by way of illustration specific preferred embodiments in which the disclosure may be practiced.

These embodiments are described in sufficient detail to enable those skilled in the art to practice them, and it is to be understood that other embodiments may be utilized and that mechanical, chemical, electrical, and procedural changes may be made without departing from the spirit and scope of the present disclosure. The following detailed description is, therefore, not to be taken in a limiting sense, and the scope of embodiments of the present invention is defined only by the appended claims.

Figure 1:
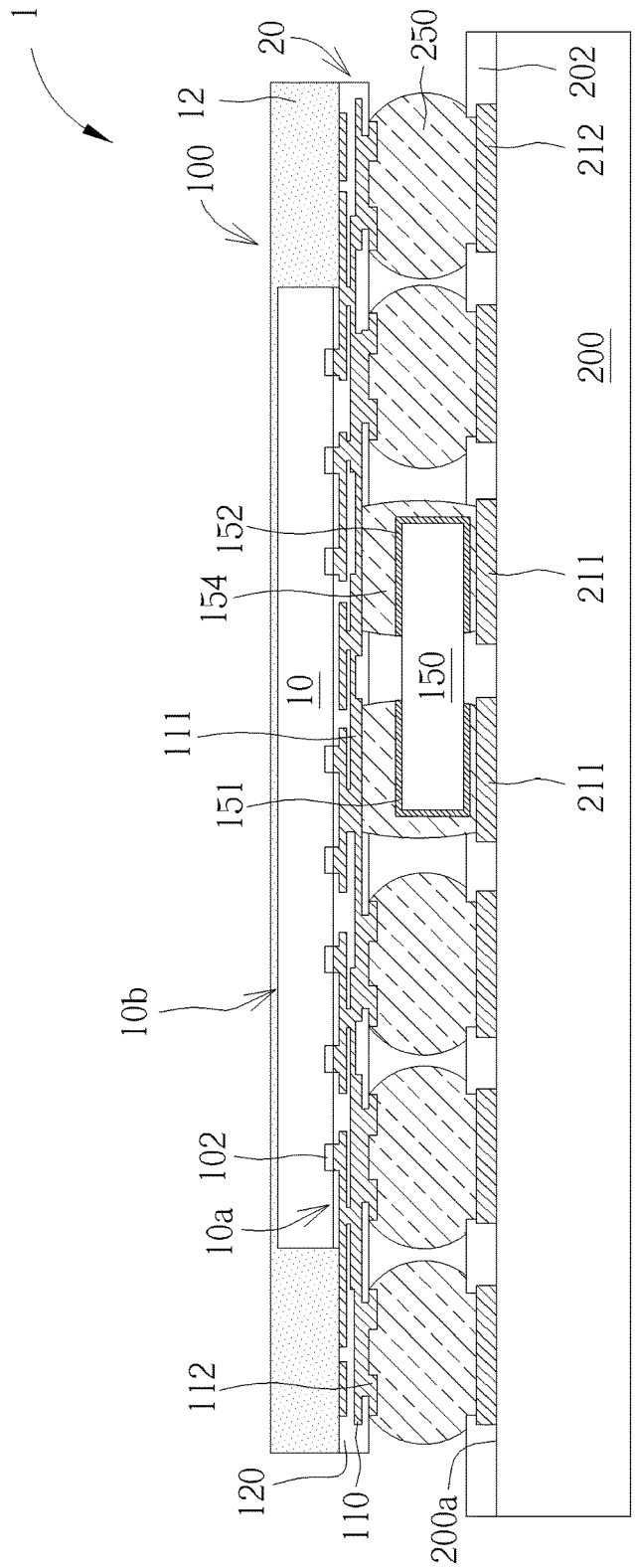
FIG. 1 is a schematic, cross-sectional diagram showing a semiconductor chip package assembly in accordance with one exemplary embodiment of the invention.

Please refer to FIG. 1. FIG. 1 is a schematic, cross-sectional diagram showing an exemplary semiconductor chip package assembly in accordance with one embodiment of the invention. As shown in FIG. 1, the semiconductor chip package assembly 1 may comprise a chip package 100 directly mounted on chip mounting surface 200a of a package substrate 200 through an array of solder balls 250.

According to the exemplary embodiment, the chip package 100 may comprise a semiconductor chip 10 that is encapsulated and surrounded by a molding compound 12. The active surface 10a having a plurality of input/output (I/O) pads 102 distributed thereon is not covered by the molding compound 12 and faces downwardly toward the package substrate 200. The inactive surface 10b of the semiconductor chip 10 may be covered with the molding compound 12, but is not limited thereto.

The surrounding molding compound 12 may have a surface that is substantially flush with the active surface 10a. A redistribution layer (RDL) structure 20 may be formed on the active surface 10a and on the surrounding molding compound 12 to fan out the I/O pads 102. The RDL structure 20 may comprise at least one dielectric layer 120, at least one metal layer 110, and redistributed pads 112 on the land side of the chip package 100.

The solder balls 250 placed on the solder pads 212 of the package substrate 200 establish electrical connection between the chip package 100 and the package substrate 200. Such configuration is also known as a fan-out wafer level package (FOWLP).

It is to be understood that the structure of the chip package 100 shown in FIG. 1 is for illustration purposes only. In some embodiments, the chip package 100 may be replaced with an unpackaged silicon chip or die. In some embodiments, the chip package 100 may be replaced with a multi-die chip package such as Fan-out WLP (FO WLP) or other types of chip package.

In some embodiments, epoxy or resin underfill (not shown) may be applied between the solder balls 250. In some embodiments, the solder balls 250 may be replaced with copper pillars or the like. In some embodiments, the package substrate 200 may be replaced with a printed circuit board (PCB).

According to the exemplary embodiment, semiconductor chip package assembly 1 further comprises at least one discrete device 150 mounted on the land side of the chip package 100. For example, the discrete device 150 may include, but not limited to, a land side capacitor, a de-coupling capacitor, a resistor, or an inductor.

According to the exemplary embodiment, the discrete device 150 such as a land side capacitor has two terminals 151 and 152, which are electrically coupled to $V_{SS}$ and $V_{DD}$ voltages, respectively, through the RDL structure 20. According to the exemplary embodiment, the two terminals 151 and 152 may be connected to the respective pads 111 in the RDL structure 20 by using solder 154.

According to the exemplary embodiment, the two terminals 151 and 152 of the discrete device 150 are also connected to the respective pads 211 on the package substrate 200 through solder 154. The pads 211 are for heat dissipation and may be dummy pads. For example, the dummy pads 211 may be electrically isolated from other metal traces on the package substrate 200, but is not limited thereto.

The dummy pads 211 and the solder pads 212 may be partially covered with a solder mask 202. The solder mask 202 may cover a peripheral region of each of the pads 211 and 212 and may expose a central region of each of the pads 211 and 212.

By providing such configuration, the heat generated by the chip package 100 can be efficiently dissipated through the solder 154, the discrete device 150, to the package substrate 200.

Figure 2:
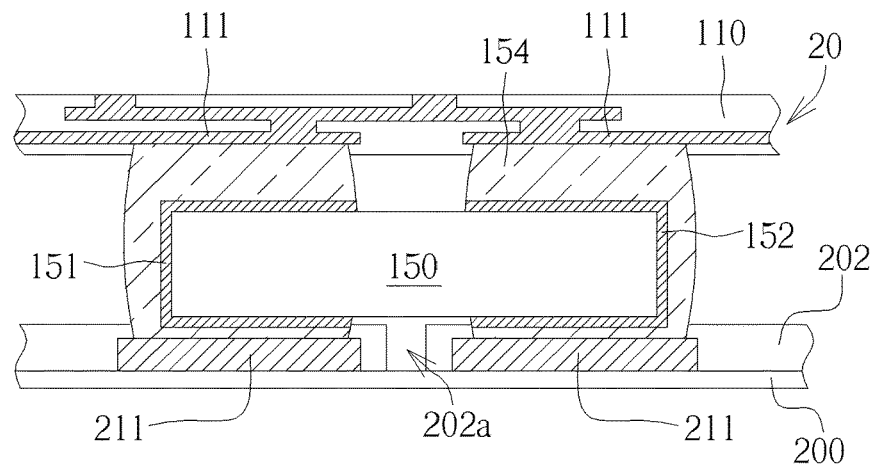
FIG. 2 to FIG. 4 show different configuration of the land side capacitor and the heat dissipating pads on the package substrate according to various embodiments.
Figure 3:
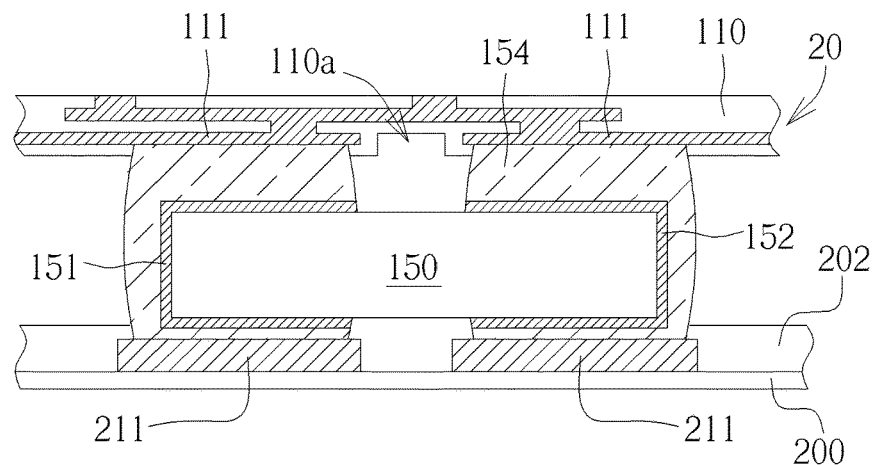
Figure 4:
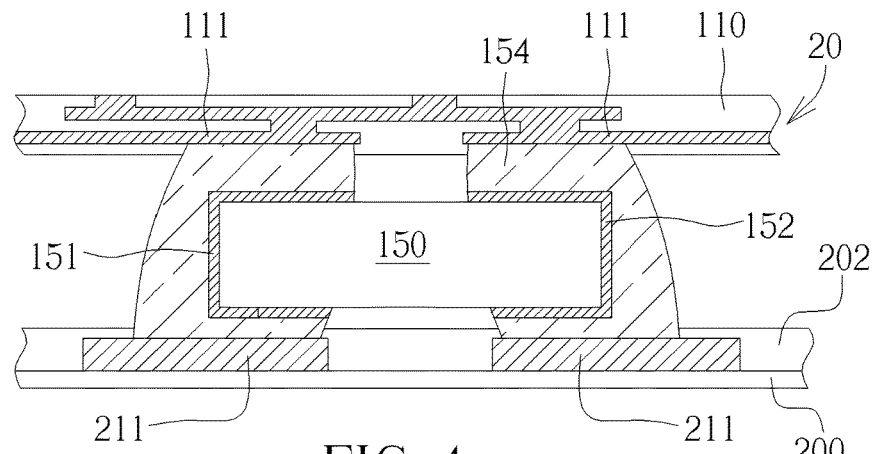

FIG. 2 to FIG. 4 show different configuration of the land side capacitor and the heat dissipating pads 211 on the package substrate 200. For the sake of simplicity, only some parts (e.g., RDL structure 20, the upper portion of the package substrate 200, and the discrete device 150) of the semiconductor chip package assembly are shown.

As shown in FIG. 2, the pads 111 of the RDL structure 20 of the chip package 100 are aligned with the dummy pads 211 on the package substrate 200. To prevent overflow of the solder 154, a recess or a slot 202a may be provided in the solder mask 202 between the two solder pads 211. If an underfill (not shown) is applied, the slot 202a may be filled with the underfill.

As shown in FIG. 3, the pads 111 of the RDL structure 20 of the chip package 100 are aligned with the dummy pads 211 on the package substrate 200. To prevent overflow of the solder 154, a recess or a slot 110a may be provided in the dielectric layer 110 between the pads 111. If an underfill (not shown) is applied, the slot 110a may be filled with the underfill.

As shown in FIG. 4, the pads 111 of the RDL structure 20 of the chip package 100 are misaligned with the dummy pads 211 on the package substrate 200. By increasing the distance between the two dummy pads 211, the overflow of the solder 154 may be avoided.

Figure 5:
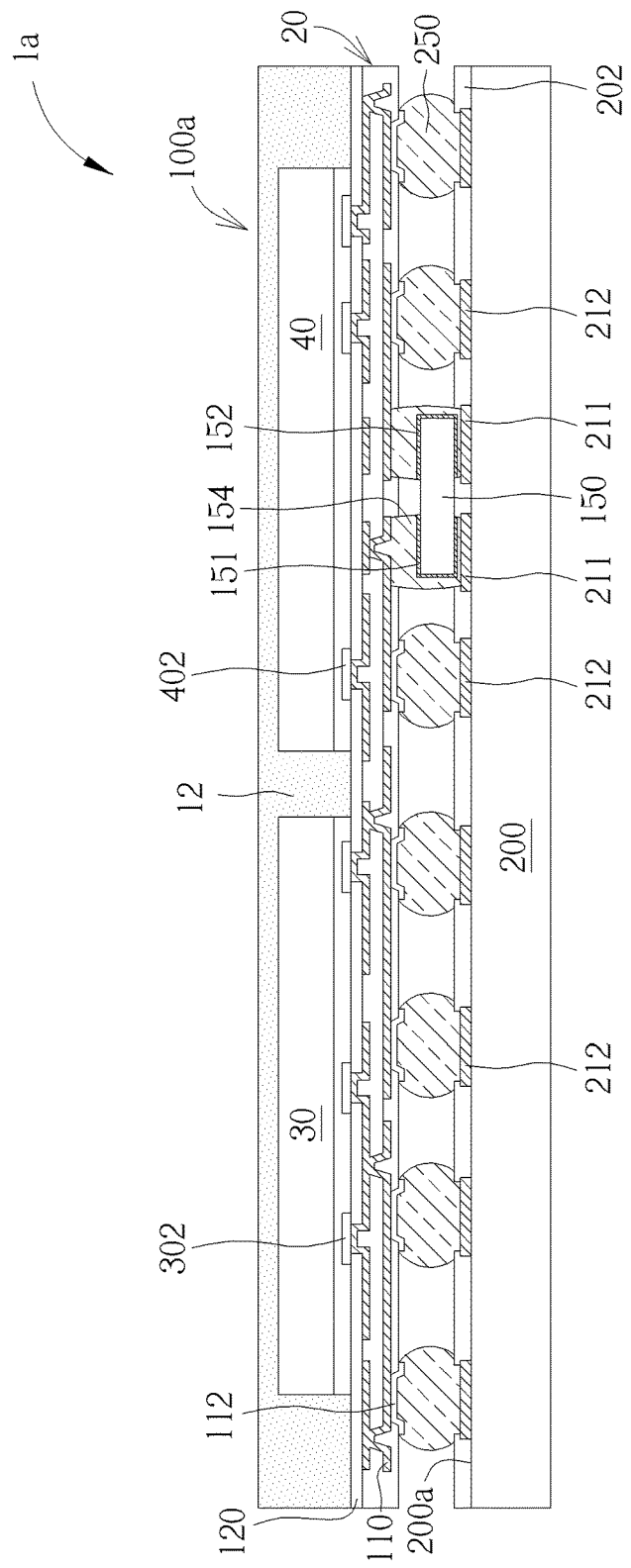
FIG. 5 illustrates a semiconductor chip package assembly according to another embodiment of the invention.

FIG. 5 illustrates another embodiment of the invention, wherein like numeral numbers designate like regions, layers or elements. As shown in FIG. 5, according to another embodiment of the invention, a semiconductor chip package assembly 1a is provided. The semiconductor chip package assembly 1a may comprise a multi-chip package 100a having at least two semiconductor chips 30 and 40 arranged on an RDL structure 20 in a side-by-side manner. The semiconductor chips 30 and 40 comprise a plurality of I/O pads 302 and 402 on their active surfaces, respectively.

Likewise, the RDL structure 20 may be formed on the active surfaces of the semiconductor chips 30 and 40, and on the molding compound 12 to fan out the I/O pads 302 and 402. The RDL structure 20 may comprise at least one dielectric layer 120, at least one metal layer 110, and redistributed pads 112 on the land side of the multi-chip package 100a.

The semiconductor chip package assembly 1a further comprises at least one discrete device 150 mounted on the land side of the multi-chip package 100a. For example, the discrete device 150 may include, but not limited to, a land side capacitor, a de-coupling capacitor, a resistor, or an inductor.

According to the exemplary embodiment, the discrete device 150 such as a land side capacitor has two terminals 151 and 152, which may be electrically coupled to $V_{SS}$ and $V_{DD}$ voltages, respectively, through the RDL structure 20. According to the exemplary embodiment, the two terminals 151 and 152 may be connected to the respective pads 111 in the RDL structure 20 by using solder 154.

According to the exemplary embodiment, the two terminals 151 and 152 of the discrete device 150 are also connected to the respective pads 211 on the package substrate 200 through solder 154. The pads 211 are for heat dissipation and may be dummy pads. For example, the dummy pads 211 may be electrically isolated from other metal traces on the package substrate 200, but is not limited thereto.

The dummy pads 211 and the solder pads 212 may be partially covered with a solder mask 202. The solder mask 202 may cover a peripheral region of each of the pads 211 and 212 and may expose a central region of each of the pads 211 and 212.

By providing such configuration, the heat generated by the multi-chip package 100a can be efficiently dissipated through the solder 154, the discrete device 150, to the package substrate 200.

Figure 6:
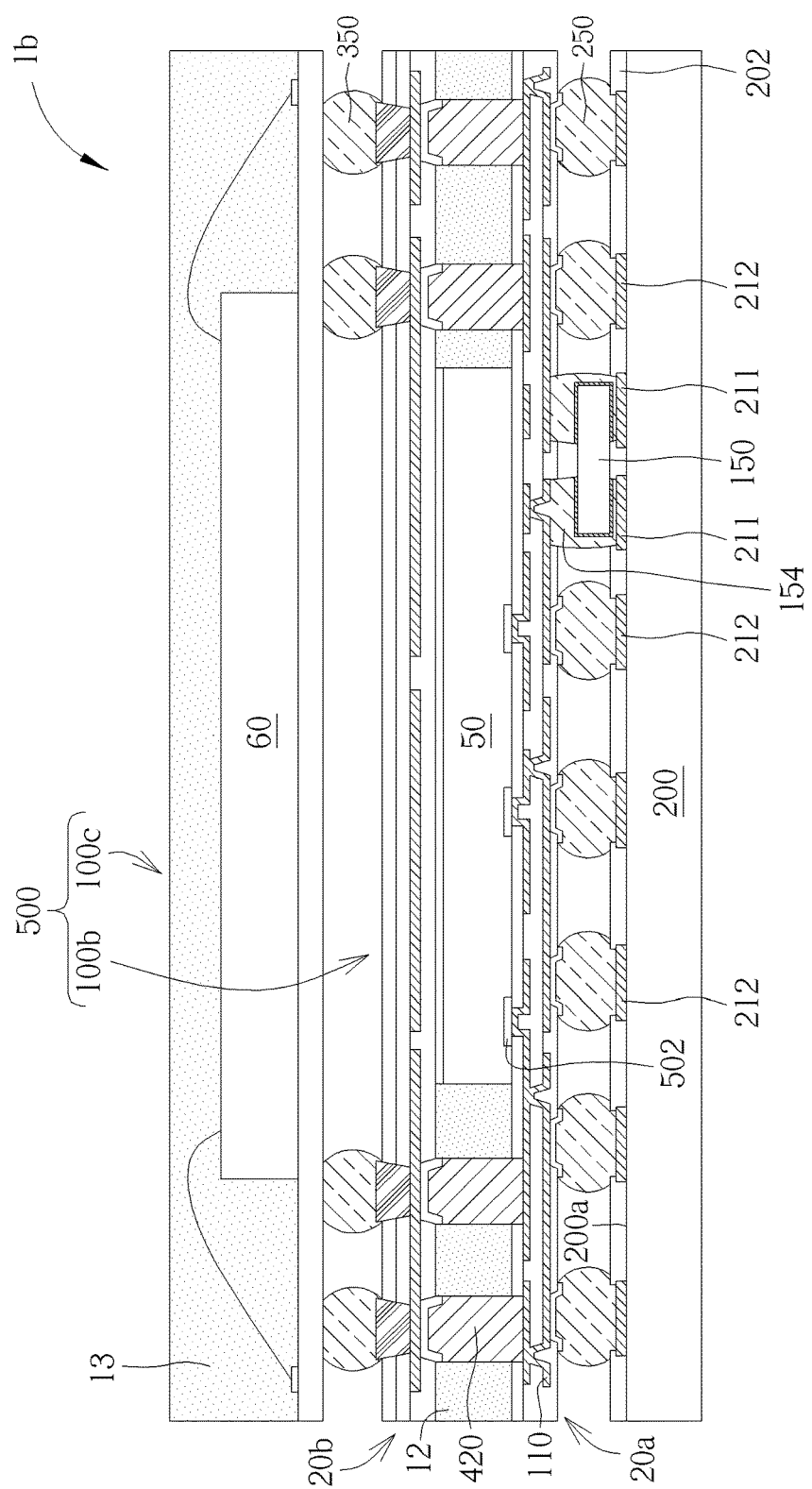
FIG. 6 illustrates a semiconductor chip package assembly according to yet another embodiment of the invention.

FIG. 6 illustrates yet another embodiment of the invention, wherein like numeral numbers designate like regions, layers or elements. As shown in FIG. 6, according to another embodiment of the invention, a semiconductor chip package assembly 1b is provided. The semiconductor chip package assembly 1b may comprise a lower chip package 100b having at least one semiconductor chip 50 disposed on a lower RDL structure 20a. The semiconductor chip 50 comprises a plurality of I/O pads 502 on its active surface. The lower RDL structure 20a may be formed on the active surface and on the surrounding molding compound 12 to fan out the I/O pads 502. The lower RDL structure 20a may comprise at least one dielectric layer 120, at least one metal layer 110, and redistributed pads 112 on the land side of the chip package 100.

An upper chip package 100c is stacked on the lower chip package 100b to constitute a package-on-package (PoP) 500. The upper chip package 100c may comprise at least one semiconductor chip 60 encapsulated by a molding compound 13. For example, the semiconductor chip 60 may be a memory chip such as a DRAM chip, but is not limited thereto. The upper chip package 100c may be electrically coupled to the lower chip package 100b through a plurality of solder balls 350 and a plurality of through mold vias (TMVs) 420. Optionally, an upper RDL structure 20b may be provided between the upper chip package 100c and the lower chip package 100b.

The semiconductor chip package assembly 1b further comprises at least one discrete device 150 mounted on the land side of the PoP 500. For example, the discrete device 150 may include, but not limited to, a land side capacitor, a de-coupling capacitor, a resistor, or an inductor.

According to the exemplary embodiment, the discrete device 150 such as a land side capacitor has two terminals 151 and 152, which may be electrically coupled to $V_{SS}$ and $V_{DD}$ voltages, respectively, through the lower RDL structure 20a. According to the exemplary embodiment, the two terminals 151 and 152 may be connected to the respective pads 111 in the lower RDL structure 20a by using solder 154.

According to the exemplary embodiment, the two terminals 151 and 152 of the discrete device 150 are also connected to the respective pads 211 on the package substrate 200 through solder 154. The pads 211 are for heat dissipation and may be dummy pads. For example, the dummy pads 211 may be electrically isolated from other metal traces on the package substrate 200, but is not limited thereto.

The dummy pads 211 and the solder pads 212 may be partially covered with a solder mask 202. The solder mask 202 may cover a peripheral region of each of the pads 211 and 212 and may expose a central region of each of the pads 211 and 212.

By providing such configuration, the heat generated by the PoP 500 can be efficiently dissipated through the solder 154, the discrete device 150, to the package substrate 200.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor chip package assembly, comprising:
   a substrate having a chip mounting surface and metal traces;
   a plurality of solder pads disposed on the chip mounting surface;
   a first dummy pad and a second dummy pad spaced apart from the first dummy pad disposed on the chip mounting surface, wherein the first dummy pad and the second dummy pad are electrically isolated from the metal traces on the substrate;
   a solder mask on the chip mounting surface and partially covering the plurality of solder pads, the first dummy pad, and the second dummy pad;
   a chip package mounted on the chip mounting surface and electrically connected to the substrate through a plurality of solder balls on the plurality of solder pads;
   a discrete device having a first terminal and a second terminal disposed between the chip package and the substrate, wherein each of the first terminal and the second terminal covers a top, a bottom, and a side surface of the discrete device;
   a first solder connecting the first terminal with the first dummy pad and the chip package;
   a second solder connecting the second terminal with the second dummy pad and the chip package, wherein the first solder and the second solder fully cover the first terminal and the second terminal on the top, the bottom, and the side surface of the discrete device, respectively; and
   a slot provided in the solder mask between the first dummy pad and the second dummy pad.

2. The semiconductor chip package assembly according to claim 1, wherein the first terminal is electrically connected to a first pad on the chip package through the first solder.

3. The semiconductor chip package assembly according to claim 2, wherein the second terminal is electrically connected to a second pad on the chip package through the second solder.

4. The semiconductor chip package assembly according to claim 3, wherein the first pad is aligned with the first dummy pad, and the second pad is aligned with the second dummy pad.

5. The semiconductor chip package assembly according to claim 1, wherein the discrete device comprises a land side capacitor, a de-coupling capacitor, a resistor, or an inductor.

6. The semiconductor chip package assembly according to claim 3, wherein the chip package comprises a semiconductor chip having an active surface, a molding compound surrounding the semiconductor chip, a redistribution layer structure on the active surface and on the molding compound.

7. The semiconductor chip package assembly according to claim 6, wherein the redistribution layer structure comprises at least one dielectric layer, at least one metal layer, a plurality of pads, the first pad and the second pad.

8. A semiconductor chip package assembly, comprising:
a substrate having a chip mounting surface and metal traces;
a plurality of solder pads disposed on the chip mounting surface;
a first dummy pad and a second dummy pad spaced apart from the first dummy pad disposed on the chip mounting surface, wherein the first dummy pad and the second dummy pad are electrically isolated from the metal traces on the substrate;
a solder mask on the chip mounting surface and partially covering the plurality of solder pads, the first dummy pad, and the second dummy pad;
a chip package mounted on the chip mounting surface and electrically connected to the substrate through a plurality of solder balls on the plurality of solder pads;
a discrete device having a first terminal and a second terminal disposed between the chip package and the substrate, wherein each of the first terminal and the second terminal covers a top, a bottom, and a side surface of the discrete device;
a first solder connecting the first terminal with the first dummy pad and the chip package;
a second solder connecting the second terminal with the second dummy pad and the chip package, wherein the first solder and the second solder fully cover the first terminal and the second terminal on the top, the bottom, and the side surface of the discrete device, respectively; and a slot provided in the solder mask between the first dummy pad and the second dummy pad, wherein the solder mask comprises a portion disposed between the first dummy pad and the slot, the portion having a top surface facing the bottom surface of the discrete device and not covered by the first solder.

9. The semiconductor chip package assembly according to claim 8, wherein the first terminal is electrically connected to a first pad on the chip package through the first solder.

10. The semiconductor chip package assembly according to claim 9, wherein the second terminal is electrically connected to a second pad on the chip package through the second solder.

11. The semiconductor chip package assembly according to claim 10, wherein the first pad is aligned with the first dummy pad, and the second pad is aligned with the second dummy pad.

12. The semiconductor chip package assembly according to claim 10, wherein the first pad is misaligned with the first dummy pad, and the second pad is misaligned with the second dummy pad.

13. The semiconductor chip package assembly according to claim 8, wherein the discrete device comprises a land side capacitor, a de-coupling capacitor, a resistor, or an inductor.

14. The semiconductor chip package assembly according to claim 10, wherein the chip package comprises a semiconductor chip having an active surface, a molding compound surrounding the semiconductor chip, a redistribution layer structure on the active surface and on the molding compound.

15. The semiconductor chip package assembly according to claim 14, wherein the redistribution layer structure comprises at least one dielectric layer, at least one metal layer, a plurality of pads, the first pad and the second pad.

* * * * *